United States Patent
Chen et al.

(10) Patent No.: US 9,343,140 B2
(45) Date of Patent: May 17, 2016

(54) BOOSTED READ WRITE WORD LINE

(71) Applicant: Taiwan Semiconductor Manufacturing Company Limited, Hsin-Chu (TW)

(72) Inventors: Yen-Huei Chen, Jhudong Township (TW); Chih-Yu Lin, Taichung (TW); Li-Wen Wang, Taichung (TW); Hung-Jen Liao, Hsin-Chu (TV); Jonathan Tsung-Yung Chang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/844,215

(22) Filed: Sep. 3, 2015

(65) Prior Publication Data
US 2015/0380082 A1  Dec. 31, 2015

Related U.S. Application Data

(62) Division of application No. 13/753,731, filed on Jan. 30, 2013, now Pat. No. 9,135,971.

(51) Int. Cl.
| | |
|---|---|
| G11C 7/00 | (2006.01) |
| G11C 11/419 | (2006.01) |
| G11C 8/16 | (2006.01) |
| G11C 8/08 | (2006.01) |
| G11C 11/418 | (2006.01) |

(52) U.S. Cl.
CPC .......... *G11C 11/419* (2013.01); *G11C 8/08* (2013.01); *G11C 8/16* (2013.01); *G11C 11/418* (2013.01)

(58) Field of Classification Search
CPC ............ G11C 7/22; G11C 7/222; G11C 8/10; G11C 8/08
USPC .............................. 365/194, 230.06
See application file for complete search history.

(56) References Cited

U.S. PATENT DOCUMENTS 5,737,275 A * 4/1998 Matthews ................ G11C 8/18
                                                                365/189.09

\* cited by examiner

*Primary Examiner* — Huan Hoang
(74) *Attorney, Agent, or Firm* — Cooper Legal Group, LLC

(57) ABSTRACT

One or more techniques or systems for boosting a read word line (RWL) or a write word line (WWL) of a two port synchronous random access memory (SRAM) bit cell array are provided herein. In some embodiments, a boosted control block is configured to generate a boosted word line signal configured to operate a RWL, a WWL, or a read write word line (RWWL). In some embodiments, the boosted word line signal includes a first stage and a second stage. For example, the first stage is associated with a first stage voltage level at a positive supply voltage (Vdd) voltage level and the second stage is associated with a second stage voltage level above the Vdd voltage level. In this manner, a read or write operation is boosted for an SRAM bit cell, because the second stage boosts a corresponding transistor in the SRAM bit cell, for example.

20 Claims, 6 Drawing Sheets

US 9,343,140 B2

BOOSTED READ WRITE WORD LINE

RELATED APPLICATION

This application is a divisional of U.S. Non-Provisional patent application Ser. No. 13/753,731, titled "BOOSTED READ WRITE WORD LINE" and filed on Jan. 30, 2013, which is incorporated herein by reference.

BACKGROUND

Generally, a two port synchronous random access memory (SRAM) bit cell is connected to a read word line (RWL) and a write word line (WWL). For example, the RWL or the WWL is run by a read write word line (RWWL) driver. Additionally, an SRAM bit cell comprises one or more transistors, such as pass gate transistors, pull up transistors, or pull down transistors.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for boosting or enhancing performance associated with a two port synchronous random access memory (SRAM) bit cell array are provided herein. For example, a two port SRAM bit cell of the two port SRAM bit cell array performs at least one of a read operation, a write operation, or a dummy read operation. In some embodiments, one or more transistors associated with the respective read, write, or dummy read operations is provided with a boosted word line signal to boost a transistor strength corresponding to at least some of the one or more transistors. In this way, at least some of the transistors associated with the respective read, write, or dummy read operations are boosted such that at least some of the transistors comprise an enhanced pulling strength. In some embodiments, a boosted word line signal comprises a first stage associated with a first stage voltage level at a positive supply voltage (Vdd) voltage level. In some embodiments, the boosted word line signal comprises a second stage associated with a second stage voltage level above the Vdd voltage level. In some embodiments, the boosted word line signal is applied to at least one of a read word line (RWL), a write word line (WWL), or a read write word line (RWWL). Accordingly, corresponding transistors are thus boosted such that at least some of the corresponding transistors comprise a boosted pulling strength, thereby enhancing performance of the SRAM bit cell or SRAM bit cell array.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
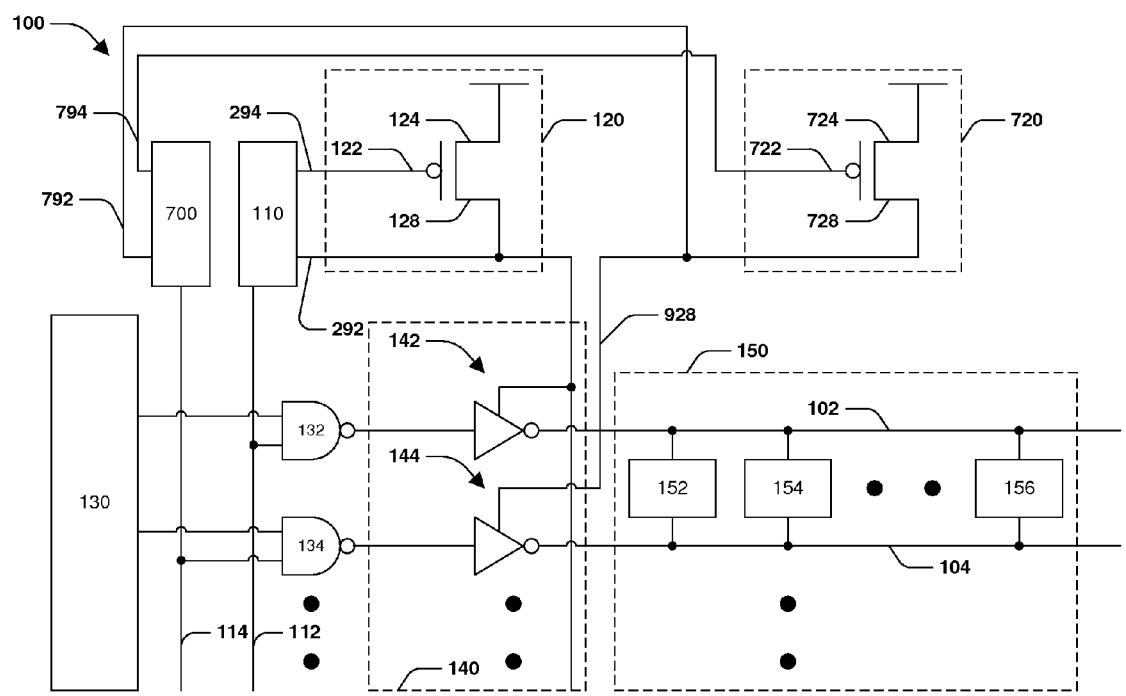
FIG. 1 is a circuit diagram of example boosted control blocks, according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

Figure 3:
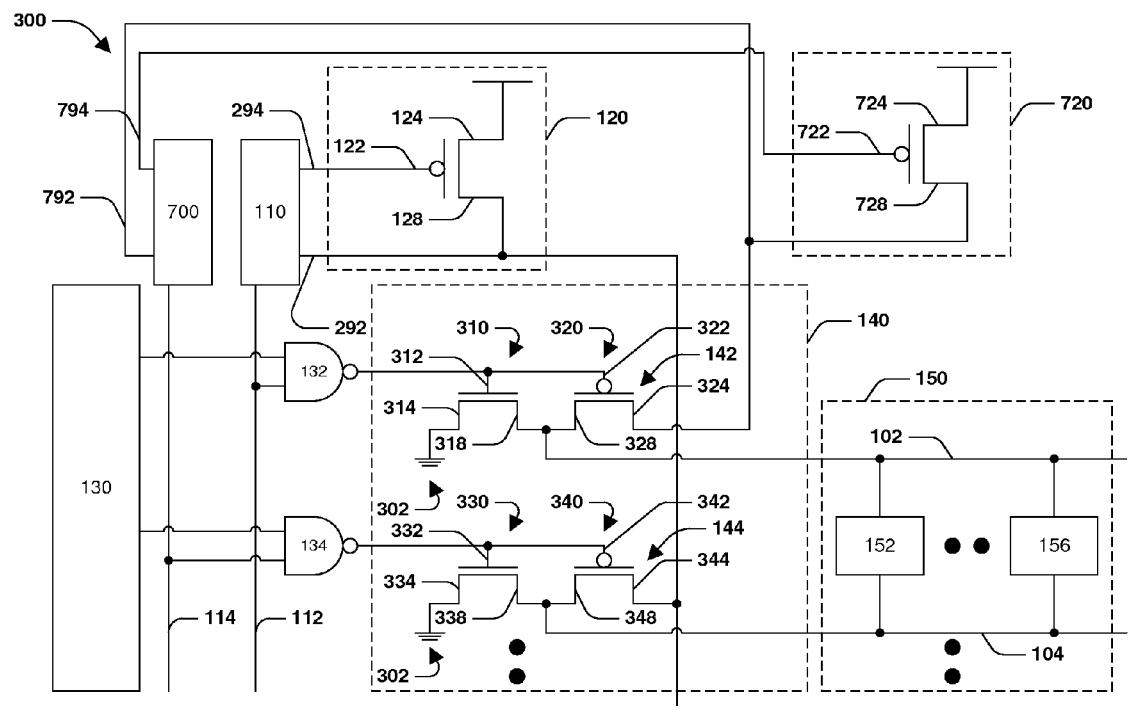
FIG. 3 is a circuit diagram of an example boosted control block, according to some embodiments.

It will be appreciated that for at least some of the figures herein, one or more boundaries, such as boundaries 120, 140, or 150 of FIG. 1 or FIG. 3, for example, are drawn with different heights, widths, perimeters, aspect ratios, etc. relative to one another merely for illustrative purposes, and are not necessarily drawn to scale. For example, because dashed or dotted lines are used to represent different boundaries, if the dashed and dotted lines were drawn on top of one another they would not be distinguishable in the figures, and thus are drawn slightly apart from one another, in at least some of the figures, so that they are distinguishable from one another, for example. As another example, because a component is associated with an irregular shape, a box drawn with a dashed line, dotted lined, etc. does not necessarily encompass an entire component. Similarly, a drawn box does not necessarily encompass merely the associated component, but encompasses at least some of one or more other components as well, in some embodiments. Accordingly, dimensions of some of these boundaries are drawn taller, shorter, wider, narrower, etc. than needed in some embodiments so that the different boundaries are visible in the figures, for example.

FIG. 1 is a circuit diagram 100 of example boosted control blocks, according to some embodiments. A circuit comprises a read boosted control block 110, a write boosted control block 700, a read word line (RWL) header 120, a write word line (WWL) header 720, a decoder 130, one or more word line drivers 140, and a two port synchronous random access memory (SRAM) bit cell array 150. In some embodiments, the RWL header 120 or the WWL header 720 is a p-type metal oxide semiconductor (PMOS) transistor. The RWL header 120 comprises a RWL header gate 122, a RWL header source 124, and a RWL header drain 128. Similarly, the WWL header 720 comprises a WWL header gate 722, a WWL header source 724, and a WWL header drain 728. In some embodiments, at least some of the one or more word line drivers 140 comprise at least one of a RWL driver 142, a WWL driver 144, or a read write word line (RWWL) driver. In some embodiments, the one or more word line drivers 140 comprise one or more additional RWWL drivers, as indicated by the dots. In some embodiments, a RWWL driver is at least one of a RWL driver or a WWL driver.

In some embodiments, the two port SRAM bit cell array 150 comprises one or more two port SRAM bit cells, such as a first SRAM bit cell 152, a second SRAM bit cell 154, and an Nth SRAM bit cell 156. The decoder 130 is a read write decoder. For example, the decoder 130 is connected to a first NAND gate 132 and a second NAND gate 134. In some embodiments, the first NAND gate 132 is connected to a boosted write enable pulse (WENP) line 114. Similarly, the second NAND gate 134 is connected to a boosted read enable pulse (RENP) line 112. In some embodiments, the WENP line 114 is associated with a WENP signal. Similarly, the RENP line 112 is associated with a RENP signal. For example, the WENP signal is configured to facilitate activation of the WWL 104. Similarly, the RENP signal is configured to facilitate activation of the RWL 102. In some embodiments, the RENP line 112 is an input for the read boosted control block 110 and the WENP line 114 is an input for the write boosted control block 700. In some embodiments, the read boosted control block 110 is configured to generate at least one of a first output 294 associated with a first word line signal or a second output 292 associated with a second boosted word line signal. Similarly, the write boosted control block 700 is configured to generate at least one of a first output 794 associated with a third word line signal or a second output 792 associated with a fourth boosted word line signal. In some embodiments, the first output 294 of the read boosted control block 110 is connected to the RWL header gate 122 and the first output 794 of the write boosted control block 700 is connected to the WWL header gate 722. In some embodiments, the second output 292 of the read boosted control block 110 is connected to the RWL header drain 128 and the second output 792 of the write boosted control block 700 is connected to the WWL header drain 728. In some embodiments, the second output 292 of the read boosted control block 110 is connected to the RWL driver 142 and the second output 792 of the write boosted control block 700 is connected to the WWL driver 144. In this way, the second boosted word line signal associated with the second output 292 of the read boosted control block 110 is configured to operate a RWL driver 142 of a two port SRAM bit cell array 150. Similarly, the fourth boosted word line signal associated with the second output 792 of the write boosted control block 700 is configured to operate a WWL driver 144 of the two port SRAM bit cell array 150. In some embodiments, an output of the first NAND gate 132 is connected to the RWL driver 142. Similarly, an output of the second NAND gate 134 is connected to the WWL driver 144. The RWL driver 142 is configured to drive a RWL 102. Similarly, the WWL driver 144 is configured to drive a WWL 104. For example, a RWWL driver, such as the RWL driver 142 or the WWL driver 144, is connected to at least one of the RWL 102 or the WWL 104 of the two port SRAM bit cell array 150, respectively. It will be appreciated that at least some of the one or more two port SRAM bit cells 152, 154, or 156 of the two port SRAM bit cell array 150 are connected to at least one of the RWL 102 or the WWL 104. In this way, a two port SRAM bit cell of the two port SRAM bit cell array 150 is controlled by at least one of a RWL driver 142, a WWL driver 144, or a RWWL driver. Additionally, a RWWL driver is selected based on at least one of a RENP signal associated with the RENP line 112, a WENP signal associated with the WENP line 114, or the decoder 130.

In some embodiments, the read boosted control block 110 is configured to generate a first word line signal at the first output 294. Similarly, the write boosted control block 700 is configured to generate a third word line signal at the first output 794. In some embodiments, the first word line signal is configured to operate the RWL header 120 of the two port SRAM bit cell array 150, while the third word line signal is configured to operate the WWL header 720 of the two port SRAM bit cell array 150. For example, the first word line signal associated with the first output 294 of the read boosted control block 110 is configured to bias the RWL header gate 122 of the RWL header 120. Similarly, the third word line signal associated with the first output 794 of the write boosted control block 700 is configured to bias the WWL header gate 722 of the WWL header 720. In some embodiments, the RWL header 120 is a PMOS transistor, the RWL header source 124 is connected to a positive supply voltage (Vdd), such as a Vdd power rail, and the RWL header drain 128 is connected to a second output 292 of the read boosted control block 110 associated with a second boosted word line signal. The WWL header 720 is also a PMOS transistor, the WWL header source 724 is connected to the Vdd rail, and the WWL header drain 728 is connected to a second output 792 of the write boosted control block 700 associated with a fourth boosted word line signal. Accordingly, when the first word line signal is at a logic low voltage level, the RWL header 120 is on, thus forming a short between the RWL header source 124 and the RWL header drain 128, at least because a logic low voltage level is applied to the RWL header gate 122 of the PMOS transistor. In this way, the first word line signal generated by the read boosted control block 110 is configured to control a voltage level associated with at least some of the one or more word line drivers 140, at least because the RWL header drain 128 is connected to at least some of the one or more word line drivers. For example, when the RWL header 120 is on, at least some of the one or more word line drivers 140 are connected to a positive supply voltage, such as Vdd. It will be appreciated that the WWL header 720 is configured to operate in a similar manner.

In some embodiments, the read boosted control block 110 is configured to generate a second boosted word line signal at a second output 292. Additionally, the write boosted control block 700 is configured to generate a fourth boosted word line signal at a second output 792. In some embodiments, the second boosted word line signal associated with the second output 292 of the read boosted control block 110 is configured to operate a RWL driver 142 of the two port SRAM bit cell array 150. Similarly, the fourth boosted word line signal associated with the second output 792 of the write boosted control block 700 is configured to operate a WWL driver 144 of the two port SRAM bit cell array 150. In some embodiments, a RWWL driver is at least one of a RWL driver or a WWL driver. In some embodiments, when the first word line signal is a logic high voltage level, the RWL header 120 is off, thus forming an open between the RWL header source 124 and the header drain 128, at least because a logic high voltage level is applied to the RWL header gate 122 of a PMOS transistor. It will be appreciated that the WWL head 720 operates in a similar manner based on the third word line signal. Accordingly, when the RWL header 120 is off, at least some of the one or more word line drivers 140 are configured to follow the second boosted word line signal, at least because the second output 292 of the read boosted control block 110 associated with the second boosted word line signal is connected to at least some of the one or more word line drivers 140. In some embodiments, the first word line signal and the third word line signal are configured to disable RWL header 120 and WWL header 720 of the two port SRAM bit cell array 150 before the second boosted word line signal is applied to a RWWL driver, such as at least one of RWL driver 142 or WWL driver 144.

In some embodiments, the circuit of FIG. 1 comprises the decoder 130, the first NAND gate 132, the second NAND gate 134, one or more additional NAND gates and an Nth NAND gate, as indicated by the dots, for example. In some embodiments, the decoder 130 and respective NAND gates 132, 134, etc. are configured to operate at least some of the one or more word line drivers 140. For example, the first NAND gate 132 is configured to operate the RWL driver 142. For example, the first NAND gate 132 is configured to activate the RWL driver 142 based on the decoder 130 and a boosted write enable pulse (WENP) line 114. Similarly, the second NAND gate 134 is configured to operate the WWL driver 144. For example, the second NAND gate 134 is configured to activate the WWL driver 144 based on the decoder 130 and a boosted read enable pulse (RENP) line 112. Accordingly, when the respective word line drivers 140 are activated, at least one of a positive supply voltage (Vdd) or a boosted word line signal, such as the second boosted word line signal or the fourth boosted word line signal, is fed through a corresponding word line driver to at least one of a RWL 102 or a WWL 104. In some embodiments, a RWWL driver, such as at least one of the RWL driver 142 or the WWL driver 144, of the two port SRAM bit cell array 150 is connected to at least one of a RWL 102 or a WWL 104 of the two port SRAM bit cell array 150. For example, at least some of the one or more word line drivers 140 are connected to at least one of a RWL header drain 128, a WWL header drain 728, the second output 792 of the write boosted control block 700 associated with the fourth boosted word line signal, or the second output 292 of the read boosted control block 110 associated with the second boosted word line signal. Accordingly, the RWL driver 142 is connected to at least one of Vdd, the second output 492 associated with the fourth boosted word line signal or the second output 292 associated with the second boosted word line signal. It will be appreciated that the WWL driver 144 is connected in a similar fashion to the WWL header 720 controlled by the write boosted control block 700. In some embodiments, when the first NAND gate 132 activates the RWL driver 142, the RWL 102 is connected to at least one of Vdd or the second output 292 associated with the second boosted word line signal. In some embodiments, when the second NAND gate 134 activates the WWL driver 144, the WWL 104 is connected to at least one of Vdd or the second output 292 associated with the second boosted word line signal. Accordingly, a RWWL driver is selected based on at least one of the RENP line 112, the WENP line 114, or the decoder 130. It will be appreciated that at least one of the RWL 102 or the WWL 104 is connected to the two port SRAM bit cell array 150. Accordingly, one or more bit cells of the two port SRAM bit cell array 150 are connected to at least one of the RWL 102 or the WWL 104. For example, the first SRAM bit cell 152 is connected to the RWL 102 and the WWL 104. Similarly, the second SRAM bit cell 154 and the Nth SRAM bit cell 156 are connected to the RWL 102 and the WWL 104.

In some embodiments, the read boosted control block 110 is configured to generate a second boosted word line signal at a second output 292, the second boosted word line signal comprising a first stage and a second stage. Similarly, the write boosted control block 700 is configured to generate a fourth boosted word line signal at a second output 792, the fourth boosted word line signal also comprising a first stage and a second stage. In some embodiments, the first stage of the second boosted word line signal or the fourth boosted word line signal is associated with a first stage voltage level at a positive supply voltage (Vdd) voltage level. In some embodiments, the second stage of the second boosted word line signal or the fourth boosted word line signals associated with a second stage voltage level above the Vdd voltage level. In some embodiments, when the first stage of the second boosted word line signal is applied to at least one of the RWL 102 or the WWL 104, one or more transistors associated with at least one of the RWL 102 or the WWL 104 receive the first stage of the second boosted word line signal. Similarly, when the second stage of the second boosted word line signal is applied to at least one of the RWL 102 or the WWL 104, one or more transistors associated with at least one of the RWL 102 or the WWL 104 receive the second stage of the second boosted word line signal. In this way, the second stage of the second boosted word line signal boosts at least some of the corresponding transistors, as will be discussed in FIG. 4.

Figure 2:
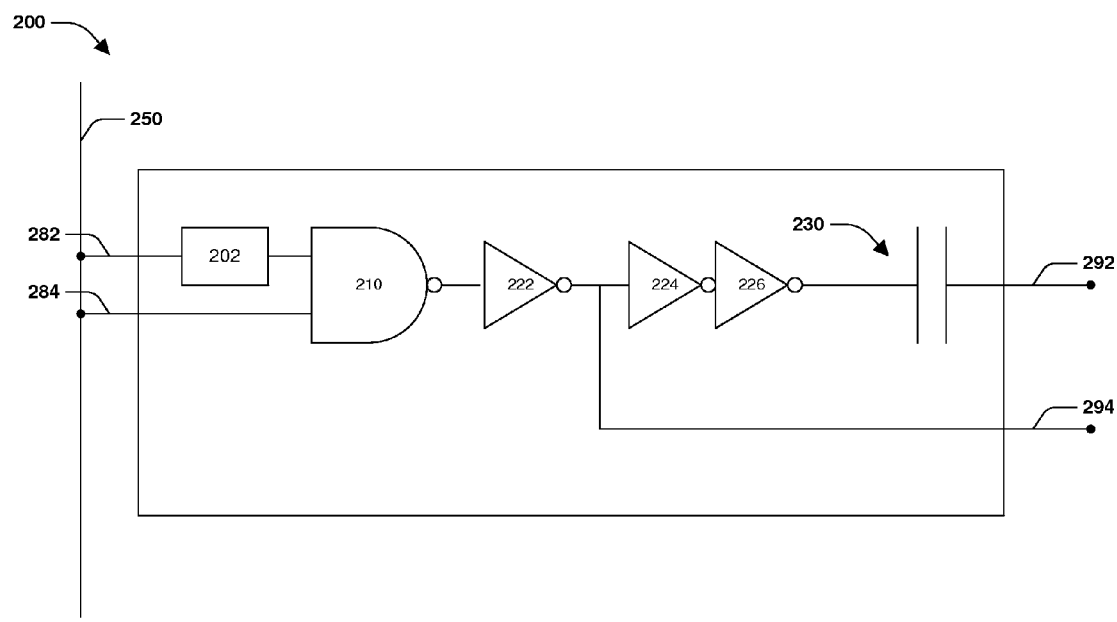
FIG. 2 is a circuit diagram of an example boosted control block, according to some embodiments.

FIG. 2 is a circuit diagram of an example boosted control block 200, according to some embodiments. The boosted control block 200 comprises a delay module 202, a first NAND gate 210, a first inverter 222, a second inverter 224, a third inverter 226, and a coupled capacitor 230. For example, an internal coupling mechanism, such as the coupled capacitor 230, is configured to boost a second stage voltage level of the second boosted word line signal. In some embodiments, the boosted control block 200 comprises a first input 282 and a second input 284. In some embodiments, the first input 282 and the second input 284 are connected to at least one of a boosted read enabled pulse (RENP) line or a boosted write enabled pulse (WENP) line. For example, both the first input 282 and the second input are connected to the RENP line or the WENP line. In some embodiments, the first NAND gate 210 comprises a first NAND input, a second NAND input, and a first NAND output. In some embodiments, the first NAND gate 210 is configured to chop a signal pulse width shorter, such as the signal from the first input 282 and the second input 284. For example, the first NAND input is connected to the delay module 202. For example, the second NAND input is connected to at least one of the first input 282, the second input 284, the RENP line, or the WENP line. In some embodiments, the first inverter 222 comprises a first inverter input and a first inverter output. For example, the first inverter input is connected to the first NAND output. For example, the first inverter output is configured to generate a first output 294 associated with a first word line signal at the first inverter output. In some embodiments, the first word line signal is configured to operate a header of a two port SRAM bit cell array, such as RWL header 120 of the two port SRAM bit cell array 150 of FIG. 1, for example. In some embodiments, the first word line signal is configured to disable the RWL header 120 of the two port SRAM bit cell array 150 before the second boosted word line signal is applied to a RWWL driver of the two port SRAM bit cell array 150, at least due to the coupled capacitor 230, for example. In some embodiments, the second inverter 224 comprises a second inverter input and a second inverter output. For example, the second inverter input is connected to the first inverter output. In some embodiments, the third inverter 226 comprises a third inverter input and a third inverter output. For example, the third inverter input is connected to the second inverter output. In some embodiments, the coupled capacitor 230 is connected to the third inverter output. For example, the coupled capacitor 230 is configured to generate a second output 292 associated with a second boosted word line signal. Accordingly, boosted control block 200 is configured to generate the second output 292 associated with a second boosted word line signal based on the coupled capacitor 230.

In some embodiments, the delay module 202 is configured to control a boosted timing delay between the second stage of the second boosted word line signal and the first stage of the second boosted word line signal. In some embodiments, the coupled capacitor 230 of the boosted control block 200 is configured to generate a second boosted word line signal. For example, at least one of the boosted control block 200 or the coupled capacitor 230 is configured to generate the second boosted word line signal at the second output 292 based on at least one of the first input 282, the second input 284, the RENP line, or the WENP line. Additionally, a size of the second stage of the second boosted word line signal is based on a size of the coupled capacitor 230, according to some embodiments.

FIG. 3 is a circuit diagram 300 of an example boosted control block, according to some embodiments. It will be appreciated that FIG. 3 is similar to FIG. 1, except that one or more components are illustrated in greater detail. For example, the circuit of FIG. 3 comprises one or more word line drivers 140. In some embodiments, at least some of the one or more word line drivers 140 are at least one of a RWL driver 142, a WWL driver 144, or a RWWL driver. In some embodiments, a RWWL driver is at least one of a RWL driver or a WWL driver. In some embodiments, the RWL driver 142 comprises a RWL n-type metal oxide semiconductor (NMOS) transistor 310 and a RWL p-type metal oxide semiconductor (PMOS) transistor 320. Similarly, the WWL driver 144 comprises a WWL NMOS transistor 330 and a WWL PMOS transistor 340. In some embodiments, the RWL NMOS transistor 310 comprises a RWL NMOS gate 312, a RWL NMOS source 314, and a RWL NMOS drain 318. In some embodiments, the RWL PMOS transistor 320 comprises a RWL PMOS gate 322, a RWL PMOS source 324, and a RWL PMOS drain 328. In some embodiments, the WWL NMOS transistor 330 comprises a WWL NMOS gate 332, a WWL NMOS source 334, and a WWL NMOS drain 338. In some embodiments, the WWL PMOS transistor 340 comprises a WWL PMOS gate 342, a WWL PMOS source 344, and a WWL PMOS drain 348. In some embodiments, an output of a first NAND gate 132 is connected to at least one of the RWL NMOS gate 312 or the RWL PMOS gate 322. Similarly, an output of a second NAND gate 134 is connected to at least one of the WWL NMOS gate 332 or the WWL PMOS gate 342. In some embodiments, at least one of the RWL NMOS source 314 or the WWL NMOS source 334 is connected to a negative supply voltage (Vss) 302. The, RWL PMOS drain 328 is connected to the second output 792 of the write boosted control block 700. The, WWL PMOS drain 344 is connected to the second output 292 of the read boosted control block 110. In some embodiments, at least one of the RWL NMOS drain 318 or the RWL PMOS drain 328 is connected to a RWL 102. Similarly, at least one of the WWL NMOS drain 338 or the WWL PMOS drain 348 is connected to a WWL 104. In this way, at least some of the one or more word line drivers 140 is controlled or operated by the decoder 130, the first NAND gate 132, the second NAND gate 134, etc., for example. In some embodiments, when the first NAND gate 132 outputs a logic high voltage, the RWL NMOS transistor 310 is biased on and the RWL PMOS transistor 320 is biased off. Accordingly, the RWL NMOS source 314 and the RWL NMOS drain 318 are shorted to the RWL 102, thus pulling the RWL 102 towards Vss 302. Additionally, it will be appreciated that the RWL PMOS source 324 is open with respect to the RWL PMOS drain 328. In some embodiments, when the second NAND gate 134 outputs a logic high voltage, the WWL NMOS transistor 330 is biased on and the WWL PMOS transistor 340 is biased off. Accordingly, the WWL NMOS source 334 and the WWL NMOS drain 348 are shorted to the WWL 104, thus pulling the WWL 104 towards Vss 302. Additionally, it will be appreciated that the WWL PMOS source 344 is open with respect to the WWL PMOS drain 348.

In some embodiments, when the first NAND gate 132 outputs a logic low voltage, the RWL NMOS transistor 310 is biased off and the RWL PMOS transistor 320 is biased on. Accordingly, the RWL NMOS source 314 is open with respect to the RWL NMOS drain 318. Additionally, the RWL PMOS source 324 and the RWL PMOS drain 328 are shorted to at least one of the header drain 128 or the second output 292 associated with the second boosted word line signal. In this way, the RWL 102 is connected to at least one of Vdd or the second output 292 associated with the second boosted word line signal. In some embodiments, when the second NAND gate 134 outputs a logic low voltage, the WWL NMOS transistor 330 is biased off and the WWL PMOS transistor 340 is biased on. Accordingly, the WWL NMOS source 334 is open with respect to the WWL NMOS drain 338. Additionally, the WWL PMOS source 344 and the WWL PMOS drain 348 are shorted to at least one of the header drain 128 or the second output 292 associated with the second boosted word line signal. In this way, the WWL 104 is connected to at least one of Vdd or the second output 292 associated with the second boosted word line signal. In this way, at least one of the decoder 130, the first NAND gate 132, the second NAND gate 134, etc. is configured to select a word line driver from the one or more word line drivers 140 and connect the selected word line driver to at least one of the header drain 128 or the second output 292 associated with the second boosted word line signal. It will be appreciated that the header drain 128 is connected to Vdd, at least when the header 120B is activated in some embodiments, for example.

Figure 4:
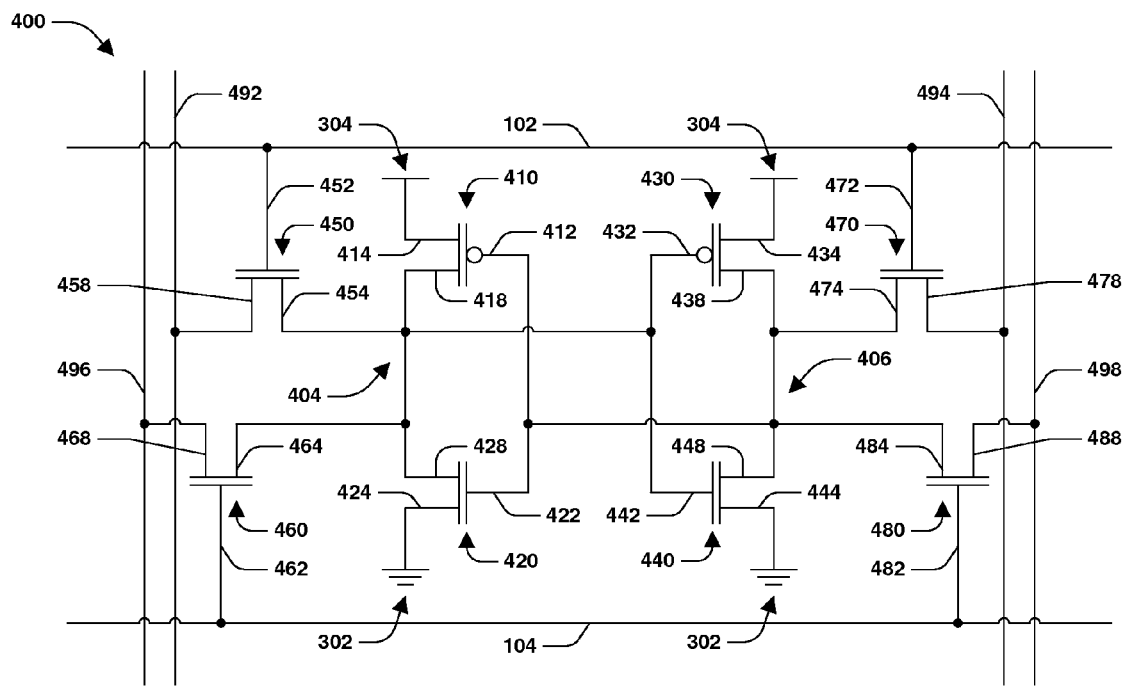
FIG. 4 is a circuit diagram of an example two port synchronous random access memory (SRAM) bit cell, according to some embodiments.

FIG. 4 is a circuit diagram 400 of an example two port synchronous random access memory (SRAM) bit cell, according to some embodiments. In some embodiments, the two port SRAM bit cell of FIG. 4 comprises a first pull up transistor 410, a second pull up transistor 430, a first pull down transistor 420, a second pull down transistor 440, a first pass gate transistor 450, a second pass gate transistor 460, a third pass gate transistor 470, and a fourth pass gate transistor 480. In some embodiments, a gate of the first pass gate transistor 452 and a gate of the third pass gate transistor 472 are connected to a read word line (RWL) 102. Additionally, a gate of the second pass gate transistor 462 and a gate of the fourth pass gate transistor 482 are connected to a write word line (WWL) 104. In some embodiments, at least one of a source of the first pull up transistor 414 or a source of the second pull up transistor 434 is connected to a positive supply voltage (Vdd) 304. In some embodiments, at least one of a source of the first pull down transistor 424 or a source of the second pull down transistor 444 is connected to a negative supply voltage (Vss) 302.

In some embodiments, a drain of the first pass gate transistor 458 is connected to a first bit line 492. In some embodiments, a source of the first pass gate transistor 454 is connected to at least one of a drain of the first pull up transistor 418, a gate of the second pull up transistor 432, a gate of the second pull down transistor 442, a drain of the first pull down transistor 428, or a source of the second pass gate transistor 464. In some embodiments, a drain of the second pass gate transistor 468 is connected to a second bit line 496. In some embodiments, a drain of the third pass gate transistor 478 is connected to a third bit line 494. In some embodiments, a source of the third pass gate transistor 474 is connected to at least one of a drain of the second pull up transistor 438, a gate of the first pull up transistor 412, a gate of the first pull down transistor 422, a drain of the second pull down transistor 448, or a source of the fourth pass gate transistor 484. In some embodiments, a drain of the fourth pass gate transistor 488 is connected to a fourth bit line 498.

In some embodiments, a boosted control block, such as boosted control block 110 is configured to at least one of generate or apply a second boosted word line signal to at least one of the RWL 102 or the WWL 104 associated with the two port SRAM bit cell of FIG. 4. It will be appreciated that the RWL 102 is connected to at least one of the first pass gate transistor 450 or the third pass gate transistor 470. For example, the RWL 102 is connected to at least one of the gate of the first pass gate transistor 452 or the gate of the third pass gate transistor 472. Similarly, the WWL 104 is connected to at least one of the second pass gate transistor 460 or the fourth pass gate transistor 480. For example, the WWL 104 is connected to at least one of the gate of the second pass gate transistor 462 or the gate of the fourth pass gate transistor 482. In some scenarios, a pass gate transistor is weaker than a corresponding pull up or pull down transistor. Accordingly, when the second boosted word line signal is applied to at least one of an associated RWL 102 or WWL 104, a strength associated with the weaker pass gate transistor is boosted, thus enabling the pass gate transistor to operate, at least because a second stage of the second boosted word line signal is associated with a second stage voltage level above a Vdd voltage level. For example, when the two port SRAM bit cell of FIG. 4 is in write-zero operation mode and the first pull up transistor 410 is stronger than the second pass gate transistor 460, the second boosted word line signal is applied to the WWL 104. During the first stage of the second boosted word line signal, a first stage voltage level is applied to the WWL 104. In some embodiments, the first stage voltage level is a Vdd voltage level. Accordingly, since the second pass gate transistor 460 is weaker than the first pull up transistor 410, a write does not occur during the first stage of the second boosted word line signal.

During a second stage of the second boosted word line signal, a second stage voltage level is applied to the WWL 104. In some embodiments, the second stage voltage level is above the Vdd voltage level. Accordingly, the second stage voltage level is applied to the gate of the second pass gate transistor 462. In some embodiments, a write operation succeeds during the second stage of the second boosted word line signal, at least because the higher second stage voltage level applied to the gate of the second pass gate transistor 462 boosts a device strength associated with the second pass gate transistor 460. In this way, the second pass gate transistor 460 pulls node 404 down such that the write-zero operation is achieved, for example. It will be appreciated that the second boosted word line signal is similarly configured to facilitate read operations in other embodiments, such as when applied to a read word line, for example.

In some embodiments, a second stage voltage level is determined based on at least one of a pass gate transistor size of an SRAM bit cell of the SRAM bit cell array or a pull up transistor size of an SRAM bit cell of the SRAM bit cell array. For example, the second stage voltage level is determined based on a size of at least one of the first pull up transistor 410, the second pull up transistor 430, the first pull down transistor 420, the second pull down transistor 440, the first pass gate transistor 450, the second pass gate transistor 460, the third pass gate transistor 470, or the fourth pass gate transistor 480.

In some embodiments, a first two port SRAM bit cell, such as bit cell 152 of FIG. 1 is executing a write operation. In some embodiments, a second two port SRAM bit cell, such as bit cell 154 of FIG. 1 is executing a dummy read operation. In some embodiments, the second bit cell 154 is associated with a half select state. In some embodiments, a boosted timing delay is maintained between the first stage and the second stage of a boosted word line signal, such as the second boosted word line signal associated with the second output 292 of FIG. 1, for example. In this way, a half select state is mitigated for the second bit cell 154, at least because the first stage of the second boosted word line signal is at the first stage voltage level of Vdd, for example. After the half select state is mitigated, the second stage of the second boosted word line signal facilitates the write operation associated with the first bit cell 152. In this way, the boosted timing delay is customized based on a half selected cell of a two port SRAM bit cell array 150, for example.

Figure 5:
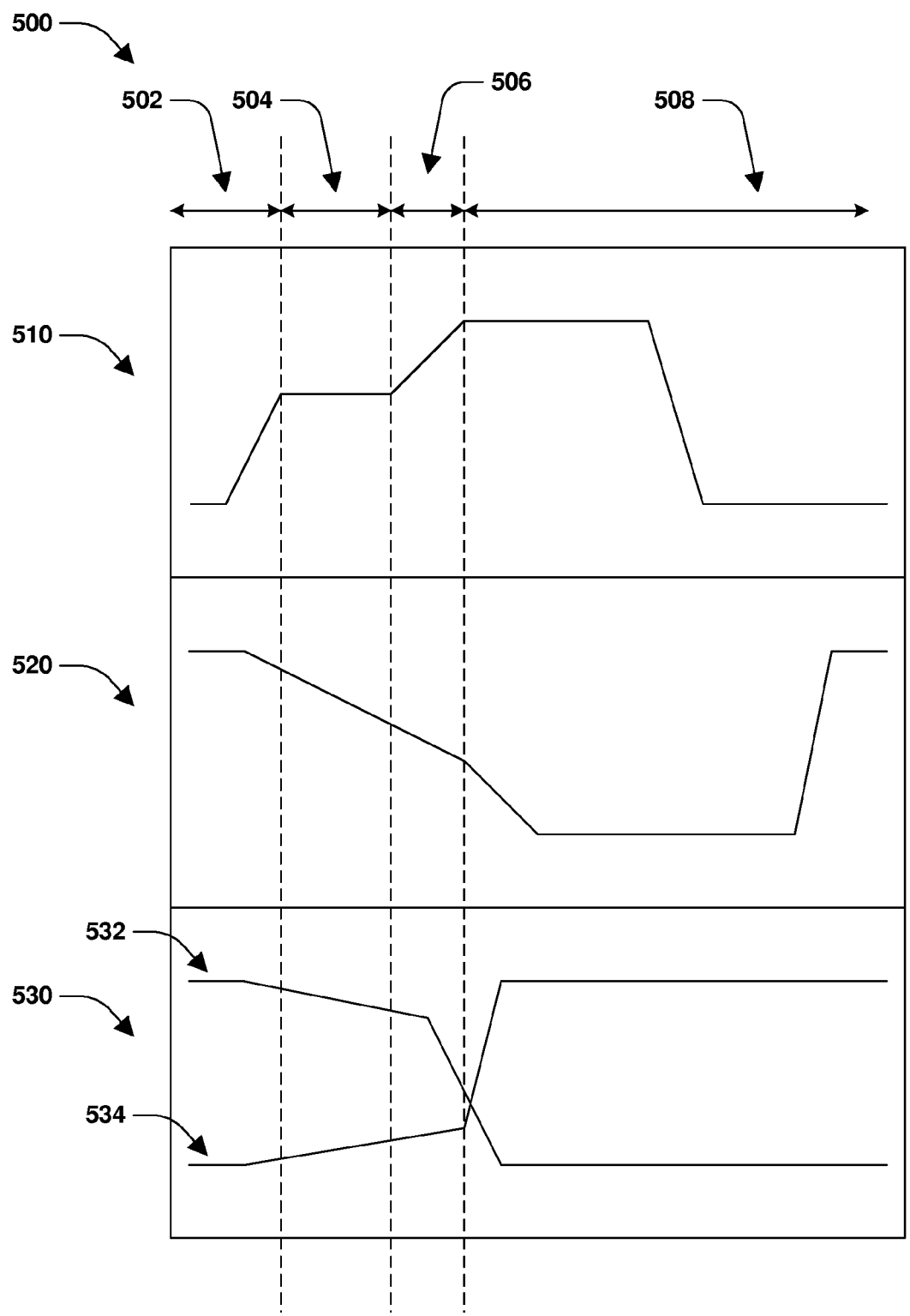
FIG. 5 is a timing diagram associated with an example boosted control block, according to some embodiments.

FIG. 5 is a timing diagram 500 associated with an example boosted control block, according to some embodiments. In some embodiments, 510 is a second boosted word line signal, such as the second boosted word line signal associated with the second output 292 of FIG. 1 or FIG. 3, for example. In some embodiments, 520 is a signal associated with a read bit line, such as bit lines 492, 494, 496, or 498 of FIG. 4, for example. In some embodiments, 530 is a signal or waveform associated with an SRAM bit cell. For example, 532 is a signal associated with node 404 of FIG. 4. For example, 534 is a signal associated with node 406 of FIG. 4. In some embodiments, 502 is associated with a first time, 504 is associated with a second time, 506 is associated with a third time, and 508 is associated with a fourth time. For example, the second boosted word line signal 510 comprises a first stage and a second stage. In some embodiments, the first stage is associated with 502 and 504. In some embodiments, the second stage is associated with 506 and 508. At 502, the second boosted word line signal 510 rises. At 504, the second boosted word line signal 510 stabilizes at a first stage voltage level at a positive supply voltage (Vdd) voltage level. In some embodiments, 504 is associated with a boosted timing delay. In other embodiments, 502 and 504 are associated with the boosted timing delay. At 506, the second boosted word line signal 510 is boosted to a second stage voltage level above the Vdd voltage level. In some embodiments, signal 510 is applied to at least one of a RWL, a WWL, or a RWWL. In some embodiments, signal 520 is pulled low during 502, 504, and 506. In some embodiments, signal 520 reaches a logic low voltage level at 508, at least because the second stage of signal 510 is boosted to the second stage voltage level above the Vdd voltage level at 508. Similarly, signals 532 and 534 achieve a crossover point during 508, at least due to the boosted second stage voltage level associated with signal 510 at 508.

Figure 6:
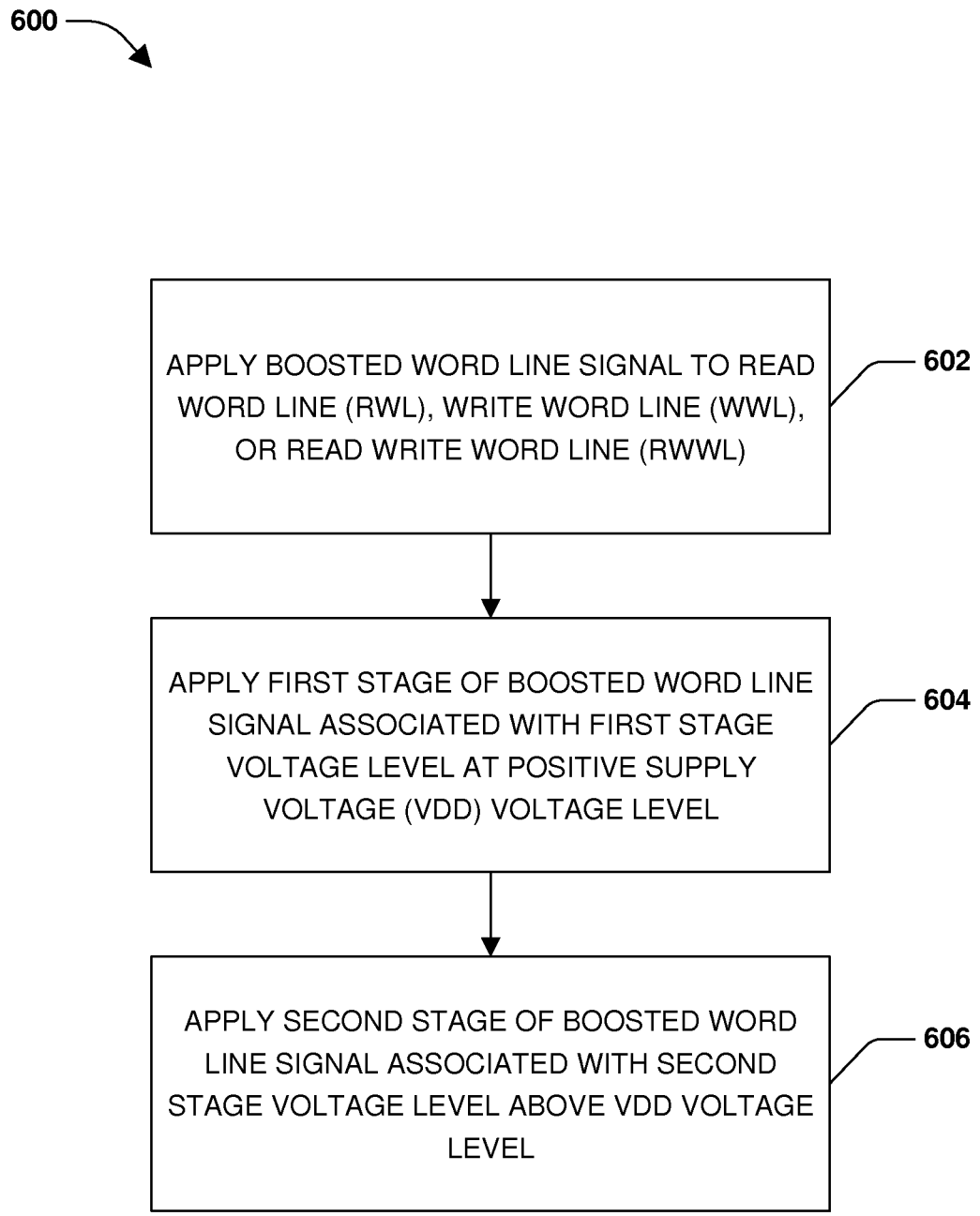
FIG. 6 is a flow diagram of an example method for enhancing performance associated with a two port synchronous random access memory (SRAM) bit cell array, according to some embodiments.

FIG. 6 is a flow diagram of an example method 600 for enhancing performance associated with a two port synchronous random access memory (SRAM) bit cell array, according to some embodiments. In some embodiments, the method 600 comprises applying a boosted word line signal to at least one of a read word line (RWL) or a write word line (WWL) of a two port synchronous random access memory (SRAM) bit cell array at 602. In some embodiments, the boosted word line signal comprises a first stage and a second stage. In some embodiments, the method 600 comprises applying a first stage of the boosted word line signal to at least one of the RWL, the WWL, or the RWWL at 604. For example, the first stage is associated with a first stage voltage level at a positive supply voltage (Vdd) voltage level. In some embodiments, the method 600 comprises applying a second stage of the boosted word line signal to at least one of the RWL, the WWL, or the RWWL at 606. For example, the second stage is associated with a second stage voltage level above the Vdd voltage level.

In some embodiments, the method 600 comprises determining the second stage voltage level based on a pass gate transistor size of an SRAM bit cell of the SRAM bit cell array. In some embodiments, the method 600 comprises determining the second stage voltage level based on a pull up transistor size of an SRAM bit cell of the SRAM bit cell array. In some embodiments, the method 600 comprises generating the boosted word line signal based on at least one of a boosted read enabled pulse (RENP) line or a boosted write enabled pulse (WENP) line. In some embodiments, the method 600 comprises maintaining a boosted timing delay between the second stage of the boosted word line signal and the first stage of the boosted word line signal. In some embodiments, the method 600 comprises determining the boosted timing delay based on a half selected cell of the two port SRAM bit cell array.

According to some aspects, a boosted control block is provided. In some embodiments, the boosted control block is configured to generate a first word line signal configured to operate a header of a two port synchronous random access memory (SRAM) bit cell array. In some embodiments, the boosted control block is configured to generate a second boosted word line signal configured to operate a read write word line (RWWL) driver of the two port SRAM bit cell array, the second boosted word line signal comprising a first stage and a second stage. For example, the first stage is associated with a first stage voltage level at a positive supply voltage (Vdd) voltage level. For another example, the second stage is associated with a second stage voltage level above the Vdd voltage level.

According to some aspects, boosted control block is provided, comprising a delay module connected to at least one of a boosted read enabled pulse (RENP) line or a boosted write enabled pulse (WENP) line. In some embodiments, the boosted control block comprises a first NAND gate comprising a first NAND input, a second NAND input, and a first NAND output. For example, the first NAND input is connected to the delay module. For example, the second NAND input is connected to at least one of the RENP line or the WENP line. In some embodiments, the boosted control block comprises a first inverter comprising a first inverter input and a first inverter output. For example, the first inverter input is connected to the first NAND output. For example, the first inverter output is configured to generate a first word line signal at the first inverter output. In some embodiments, the boosted control block comprises a second inverter comprising a second inverter input and a second inverter output. For example, the second inverter input is connected to the first inverter output. In some embodiments, the boosted control block comprises a third inverter comprising a third inverter input and a third inverter output. For example, the third inverter input is connected to the second inverter output. In some embodiments, the boosted control block comprises a coupled capacitor connected to the third inverter output. For example, the coupled capacitor is configured to generate a second boosted word line signal.

According to some aspects, a method for enhancing performance associated with a two port synchronous random access memory (SRAM) bit cell array is provided, comprising applying a boosted word line signal to at least one of a read word line (RWL) or a write word line (WWL) of a two port synchronous random access memory (SRAM) bit cell array. For example, the boosted word line signal comprises a first stage and a second stage. In some embodiments, the first stage is associated with a first stage voltage level at a positive supply voltage (Vdd) voltage level. In some embodiments, the second stage is associated with a second stage voltage level above the Vdd voltage level.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A boosted control block, comprising:
   a delay module coupled to at least one of a boosted read enabled pulse (RENP) line or a boosted write enabled pulse (WENP) line;
   a first NAND gate comprising a first NAND input, a second NAND input, and a first NAND output, wherein:
   the first NAND input is coupled to the delay module; and
   the second NAND input is coupled to the at least one of the RENP line or the WENP line;
   a first inverter comprising a first inverter input and a first inverter output, wherein:
   the first inverter input is coupled to the first NAND output, and
   the first inverter output is configured to generate a first word line signal at the first inverter output;
   a second inverter comprising a second inverter input and a second inverter output, wherein the second inverter input is coupled to the first inverter output;
   a third inverter comprising a third inverter input and a third inverter output, wherein the third inverter input is coupled to the second inverter output; and
   a coupled capacitor coupled to the third inverter output, wherein the coupled capacitor is configured to generate a second boosted word line signal.

2. The boosted control block of claim 1, wherein the coupled capacitor is configured to generate the second boosted word line signal based on the at least one of the RENP line or the WENP line.

3. The boosted control block of claim 1, wherein the first word line signal is configured to operate a header of a two port synchronous random access memory (SRAM) bit cell array.

4. The boosted control block of claim 3, wherein the first word line signal is configured to disable a header of a two port synchronous random access memory (SRAM) bit cell array before the second boosted word line signal is applied to a read write word line (RWWL) driver of the two port SRAM bit cell array.

5. The boosted control block of claim 1, wherein the second boosted word line signal is configured to operate a read write word line (RWWL) driver of a two port synchronous random access memory (SRAM) bit cell array.

6. The boosted control block of claim 5, wherein the RWWL driver of the two port SRAM bit cell array is coupled to at least one of a read word line (RWL) or a write word line (WWL) of the two port SRAM bit cell array.

7. The boosted control block of claim 5, wherein the RWWL driver is selected based on at least one of the RENP line, the WENP line, or a decoder.

8. A boosted control block, comprising:
a delay module coupled to at least one of a boosted read enabled pulse (RENP) line or a boosted write enabled pulse (WENP) line;
a first logic gate, wherein:
a first input of the first logic gate is coupled to the at least one of the boosted read enabled pulse (RENP) line or the boosted write enabled pulse (WENP) line, and
a second input of the first logic gate is coupled to the delay module;
a first output for supplying a word line signal to a word line header;
a capacitor configured to generate a boosted word line signal, wherein the first output is between an output of the first logic gate and the capacitor; and
a second output for supplying the boosted word line signal to a word line driver, the second output between the capacitor and the word line driver.

9. The boosted control block of claim 8, comprising:
a second logic gate coupled between the first logic gate and the first output.

10. The boosted control block of claim 8, comprising:
an inverter coupled between the first output and the second output.

11. The boosted control block of claim 10, wherein the inverter is coupled between the first output and the capacitor.

12. The boosted control block of claim 8, comprising:
an inverter coupled between the first logic gate and the first output.

13. The boosted control block of claim 8, wherein the first logic gate comprises a NAND gate.

14. The boosted control block of claim 8, comprising:
a chain of two or more inverters coupled between the first output and the capacitor.

15. The boosted control block of claim 8, wherein the first logic gate comprises a NAND gate and the boosted control block comprises an inverter coupled between the NAND gate and the first output.

16. The boosted control block of claim 8, wherein the first output is coupled to a gate of the word line header and the second output is coupled to a source/drain region of the word line header.

17. The boosted control block of claim 8, wherein the word line signal is configured to operate a header of a two port synchronous random access memory (SRAM) bit cell array.

18. The boosted control block of claim 8, wherein the delay module is configured to introduce a specified delay between a start of a first stage of at least one of a read or write and a start of a second stage of the at least one of a read or write.

19. A boosted control block for a synchronous random access memory (SRAM) bit cell array, the boosted control block comprising:
a delay module configured to receive an enable pulse and generate a delayed enable pulse;
a first set of one or more logic gates configured to receive the enable pulse, receive the delayed enable pulse, and generate a first output signal at a first output based upon the enable pulse and the delayed enable pulse, to operate a header circuit to apply a first voltage to a read write word line (RWWL) driver of the SRAM bit cell array; and
a capacitor, coupled to the first set of one or more logic gates and configured to generate a second output signal at a second output, the second output signal applying a second voltage to the read write word line (RWWL) driver of the SRAM bit cell array, wherein:
the capacitor is between the first output and the second output,
a start of the second output is delayed relative a start of the first output by a specified delay, and
the second voltage is different than the first voltage.

20. The boosted control block of claim 19, wherein the second voltage is greater than the first voltage.

* * * * *